United States Patent [19]

Tsuruta

[11] Patent Number: 5,357,077
[45] Date of Patent: Oct. 18, 1994

[54] APPARATUS FOR MARKING SEMICONDUCTOR DEVICES

[75] Inventor: Hisayuki Tsuruta, Tokyo, Japan

[73] Assignee: NEC Corporation, Tokyo, Japan

[21] Appl. No.: 183,325

[22] Filed: Jan. 19, 1994

[30] Foreign Application Priority Data

Jan. 20, 1993 [JP] Japan .................................. 5-007120

[51] Int. Cl.$^5$ ............................................. B23K 26/00
[52] U.S. Cl. ............................ 219/121.68; 219/121.82
[58] Field of Search ..................... 219/121.82, 121.68, 219/121.69

[56] References Cited

U.S. PATENT DOCUMENTS

| 4,323,755 | 4/1982 | Nierenberg | 219/121.68 |
| 4,370,542 | 1/1983 | Mills et al. | 219/121.68 |
| 4,791,267 | 12/1988 | Yokoyama et al. | 219/121.69 |
| 4,965,829 | 10/1990 | Lemelson | 219/121.69 |

Primary Examiner—C. L. Albritton
Attorney, Agent, or Firm—Young & Thompson

[57] ABSTRACT

The subject is an apparatus for consecutively marking a plurality of packaged semiconductor devices such as ICs by using a laser beam marker. A plurality of packaged semiconductor devices are put into a tubular holder so as to form a single file. The tubular holder is generally rectangular in cross-sectional shape and has a lengthwise opening in the upside wall. The tubular holder is placed on a conveyor belt and secured to the conveyor belt by guide belts each of which makes tight contact with the upside wall or one of the side walls of the tubular holder and advances in the same direction as the conveyor belt. On the conveyor belt the tubular holder passes a marking station where a laser beam is projected on the semiconductor devices in the holder one after another. The apparatus includes a computerized controller to automatically control the positions of the conveyor belt and the guide belts according to the width and height of the tubular holder. In changing the object of marking to another kind of semiconductor device there arises a change in the width and/or height of the tubular holder, but the positions of the conveyor belt and the guide belts can quickly be adjusted by the function of the controller.

4 Claims, 2 Drawing Sheets

APPARATUS FOR MARKING SEMICONDUCTOR DEVICES

BACKGROUND OF THE INVENTION

This invention relates to a marking apparatus for consecutively marking a plurality of packaged semiconductor devices.

In the commercial production of ICs and many other semiconductor devices the final step is making markings on each semiconductor device which is already packaged. It is prevailing to use a laser beam marker.

Packaged semiconductor devices are transferred to a feeding station precedent to a marking station usually by using tubular holders in each of which a plurality of semiconductor devices are received in a single file. In the case of a conventional marking apparatus, at the feeding station one of the tubular holders is set lengthwise at an end of a chute to release the semiconductor devices into the chute in a file. The chute extends to a turntable which is a part of the marking station. The turntable has a plurality of radially arranged receptacles each of which accepts one of the semiconductor devices transferred by the chute. The turntable stops rotating when any of the receptacles arrives at a marking position, and a laser beam is projected from a laser beam marker on the upside face of the semiconductor device held in that receptacle. By subsequent rotation of the turntable holding the already marked semiconductor device comes into alignment with another chute which extends to a receiving station, and the semiconductor device is released into the chute as the turntable stops rotating. In the receiving station a plurality of marked semiconductor devices are put into a tubular holder in preparation for transfer to another station.

In the above described apparatus the dimensions of the tubular holders, chutes and the receptacles of the turntable correspond to the dimensions of a packaged semiconductor device of a specific kind. Therefore, when the object of marking is changed to another kind of semiconductor device there is the need of adjusting the tubular holder handling parts in the feeding and receiving stations, replacing some of such parts and replacing the chutes and the turntable. Usually it takes about 1 hr to accomplish such adjustment and replacement of parts. This is an obstacle to enhancement of a net working rate of the marking apparatus. Besides, the marking operation using the turntable cannot be regarded as sufficiently high in productivity in view of the fact that the operation time for each semiconductor device amounts to about 1.0 to 1.5 sec.

SUMMARY OF THE INVENTION

It is an object of the present invention to provide a marking apparatus for consecutively and efficiently marking a plurality of packaged semiconductor devices without wasting a long time in changing the object of marking to another kind of semiconductor device.

A marking apparatus according to the invention uses a conventional laser beam marker and a tubular holder for holding therein a plurality of packaged semiconductor devices in a single file. The tubular holder is generally rectangular in cross-sectional shape and has two opposite side walls, a downside wall and an upside wall which has a lengthwise opening to expose an upside face of each of the packaged semiconductor devices in the holder. According to the invention the marking apparatus comprises a conveyor belt on which the tubular holder is placed with the downside wall in contact with the belt. The conveyor belt is arranged so as to pass a marking station where a laser beam is projected from the laser beam marker so as to impinge on the upside face of one of the semiconductor devices in the tubular holder. The apparatus further comprises at least one upper guide belt which makes tight contact with the upside wall of the tubular holder on the conveyor belt and is driven so as to advance in the same direction as the conveyor belt, at least one side guide belt which makes tight contact with one of the two side walls of the tubular holder on the conveyor belt and advances in the same direction as the conveyor belt, first shift means for varying a first distance which is the distance between the conveyor belt and the upper guide belt(s), second shift means for varying a second distance which is the distance between each side guide belt and a plane which is perpendicular to the conveyor belt and contains a longitudinal center axis of the conveyor belt, and control means for computing the first and second distances according to the height and width of the tubular holder and controlling the operation of the first and second shift means according to the results of the computation.

With the marking apparatus according to the invention laser beam marking is accomplished without releasing the semiconductor devices from the tubular holder on the conveyor belt, and all the semiconductor devices in the holder are consecutively marked one after another while the conveyor belt is advancing at a constant speed. Therefore, it is possible to considerably shorten the marking operation time for each semiconductor device. That is, the operation time for each semiconductor device becomes about 0.2 to 0.6 sec, which is remarkable by comparison with about 1.0 to 1.5 sec in the case of a conventional marking apparatus using a turntable.

Furthermore, every shift of the object of marking from one kind of semiconductor device to another kind of semiconductor device can be accomplished very quickly. In the apparatus according to the invention it suffices to adjust the positions of the conveyor belt and guide belts according to the width and height of the newly employed tubular holder, and the adjustment can be automatically and very quickly performed by merely inputting the item name of the new object of marking into the computarized controller of the apparatus. It takes only about 15 sec to accomplish the needed adjustment of belt positions. This is surprisingly quick by comparison with about 1 hr consumed in adjusting and replacing parts of a conventional apparatus using chutes and a turntable.

DESCRIPTION OF THE PREFERRED EMBODIMENTS

Figure 1:
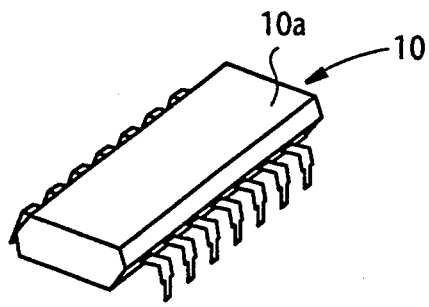
FIG. 1 is a schematic perspective view of a packaged semiconductor device ready for marking.

FIG. 1 shows an example of semiconductor devices to be marked with an apparatus according to the invention. The semiconductor device 10 (e.g. an IC) is already packaged by using a conventional dual-in-line package and is ready for marking. It is intended to make markings on the upside face 10a of the packaged device 10.

Figure 2:
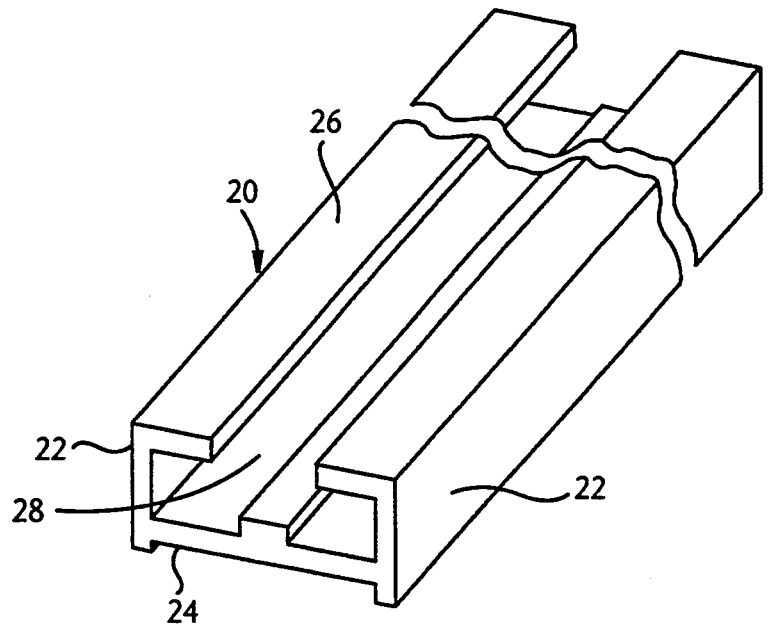
FIG. 2 is a perspective view of a tubular holder used for transferring a plurality of packaged semiconductor devices in a single file.

FIG. 2 shows a tubular holder 20 in which a plurality of semiconductor devices 10 can be held in a single file. The holder 20 is generally rectangular in cross-sectional shape and has a pair of parallel side walls 22, a downside wall 24 and an upside wall 26 which has a slot-like, lengthwise opening 28.

Figure 3:
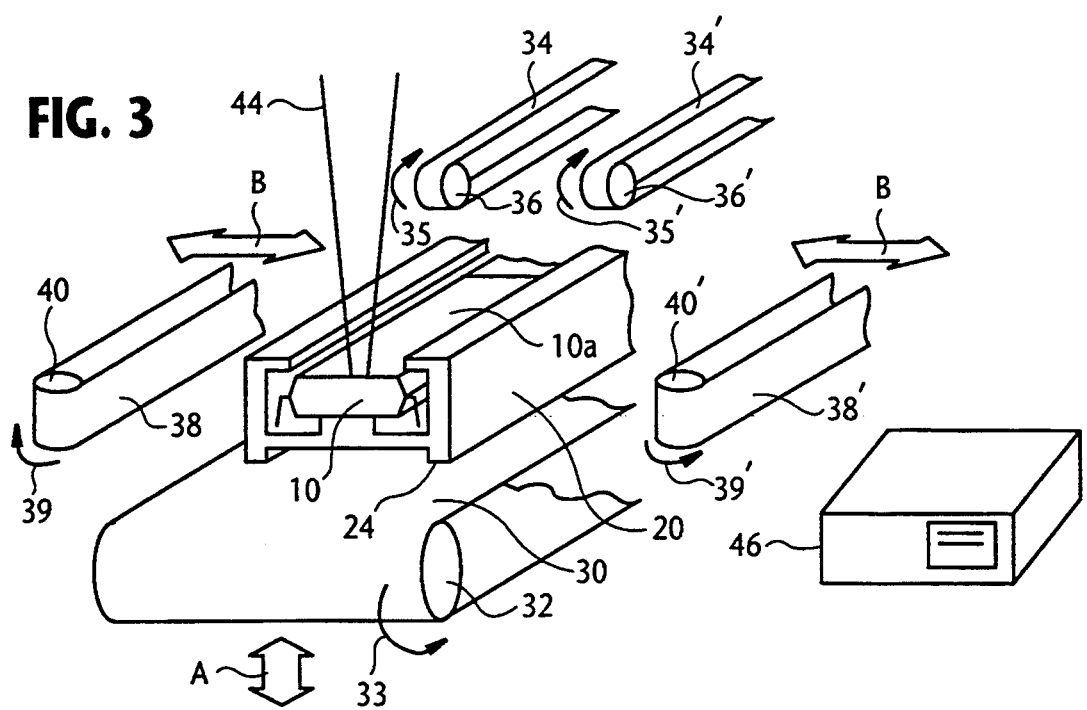
FIG. 3 is a diagrammatic illustration of the construction of a marking apparatus embodying the present invention.
Figure 4:
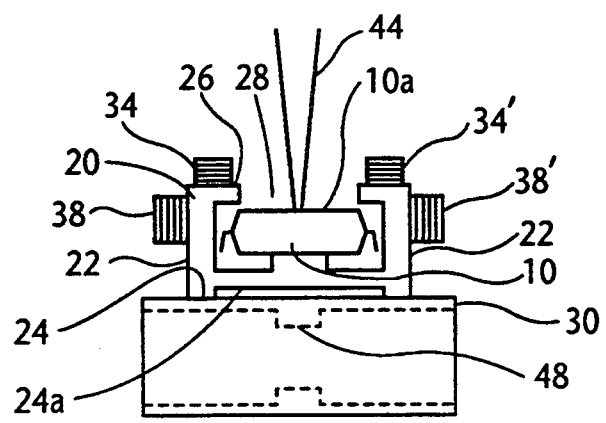
FIG. 4 is a schematic front view of the transfer system in the apparatus of FIG. 3.

Referring to FIGS. 3 and 4, a marking apparatus according to the invention includes a transfer system which employs a belt conveyor having a conveyor belt 30 and driving pulleys 32. In this embodiment the conveyor belt 30 is parallel to a horizontal plane. At a feeding station a number of packaged semiconductor devices 10 are put into the tubular holder 20 so as to make a single file in the holder 20, and the tubular holder 20 is lengthwise placed on the conveyor belt 30. The upside face 10a of every semiconductor device 10 in the tubular holder 20 is exposed in the upper opening 28 of the holder 20. By rotation of the pulleys 32 in the direction of arrow 33 the conveyor belt 30 advances together with the tubular holder 20 toward the marking station at a constant speed. To secure the tubular holder 20 onto the conveyor belt 30, the transfer system includes a plurality of guide belts each of which advances and recedes in the manner of a conveyor belt. In this embodiment there are a pair of upper guide belts 34 and 34' which are parallel to a horizontal plane and a pair of side guide belts 38 and 38' which are parallel to a vertical plane. The upper belts 34 and 34' are respectively driven by pullyes 36 and 36' rotating (in the direction of arrows 35 and 35') about a horizontal axis. The side belts 38 and 38' are respectively driven by pullyeys 40 and 40' rotating (in the directions of arrows 39 and 39', respectively) about vertical axes. In operation, as shown in FIG. 4, the upper belts 34, 34' make tight contact with the upside wall 26 of the tubular holder 20 so as not close the opening 28, and the two side belts 38 and 38' make tight contact with the two side walls 22 of the tubular holder 20, respectively. The upper and side belts 34, 34', 38, 38' run syncronously with the conveyor belt 30, and all the belts 30, 34, 34', 38, 38' run at the same speed.

When each of the semiconductor devices 10 in the tubular holder 20 arrives at the marking station a laser beam marker (not shown) projects a laser beam 44 on the upside face 10a of the semiconductor device 10 to make prescribed markings. As the tubular holder 20 is linearly transferred so as to pass through the marking station, all the semiconductor devices 10 in the holder 20 are marked in succession.

As can be seen in FIG. 4, it is preferable to recess the outer surface of the downside wall 24 of the tubular holder 20 in a central region 24a along the longitudinal center axis in order that the downside wall 24 makes contact with the conveyor belt 30 only in the remaining side regions. This is effective for shielding the semiconductor devices 10 in the holder 20 from any vibrational motion of the conveyor belt 30.

The marking apparatus must be useful for marking many kinds of semiconductor devices different in dimensions, and hence the transfer system must be able to transfer many kinds of tubular holders different in width and/or height. Therefore, in the transfer system according to the invention the positions of the conveyor belt and guide belts are adjustable. In this embodiment the vertical position of the conveyor belt 30 is adjustable in the directions of arrow A such that a predetermined constant distance can be kept between the marking face 10a of the semiconductor device 10 and a projection lens (not shown) of the laser marker when both the conveyor belt 30 and the upper belts 34, 34' make contact with the tubular holder 20. The horizontal positions of the side belts 38, 38' can be changed in the directions of arrows B with respect to a vertical plane containing the longitudinal center axis of the conveyor belt 30. Actuators (not shown) for adjusting the positions of the belts 30, 38, 38' are controlled by a computarized controller 46 which stores width and height data of the tubular holder 20 for any of many kinds of semiconductor devices to be marked with the marking apparatus. In changing the tubular holder 20 to another tubular holder of different size the belt positions can be automatically adjusted by merely informing the controller 46 of the item name or code number of the semiconductor device in the newly employed holder 20. Then the controller 46 computes the necessary amount of displacement of each belt 30, 38, 38' and commands the actuators to execute the results of computation.

Figure 5:
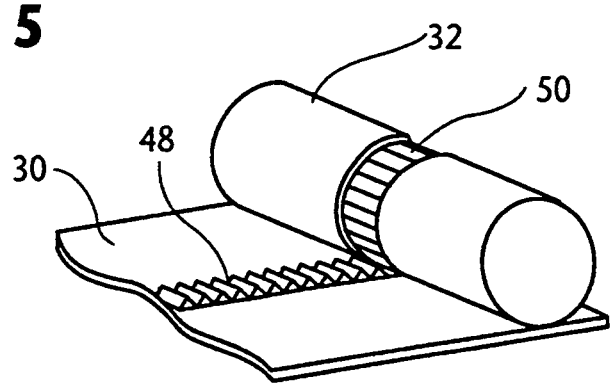
FIG. 5 is a fragmentary perspective view of a conveyor belt in the transfer system of FIG. 4 and a belt pulley for driving the belt.

Referring to FIG. 5, the conveyor belt 30 has a series of teeth 48 on the inner surface so as to serve as a sort of rack, and the driving pulley 32 has cricumferential teeth 80 so as to serve as a sort of pinion. The teeth 48 project from the inner surface of the belt 30, and the teeth 50 are recessed from the cylindrical surface of the pulley 32 so that the teeth 48 can mesh with the teeth 50 without causing vibrational motion of the tubular holder 20 on the belt 30 and resultant deviation of the marking position. As a further precaution, the width of the teeth series 48 is made very narrow so that the tubular holder 20 on the belt 30 can straddle the teeth 48 even in the case of the tubular holder of the smallest width.

Figure 6:
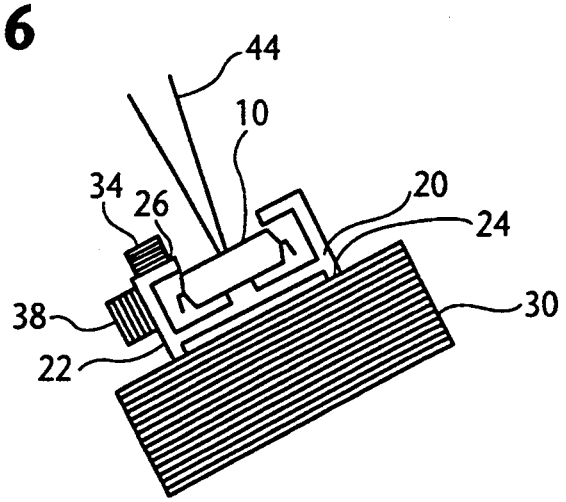
FIG. 6 shows a modification of the marking apparatus of FIG. 3 in a front view comparable to FIG. 4.

As shown in FIG. 6, the conveyor belt 30 may be widthwise tilted by tilting the axis of each pulley 32 so as to form a certain angle with a horizontal plane. The longitudinal center axis of the tilted belt 30 is still horizontal. As a natural consequence the tubular holder 20 on the conveyor belt 30 tilts, but downward slippage of the holder 20 is prevented by the side and upper guide belts 38 and 38 which are also tilted. The tilted arrangement has an advantage that deviations of the marking position can be prevented more surely since all the semiconductor devices 10 in the tube 20 become in accurate alignment by uniformly tilting to one side of the holder 20. Besides, it is possible to decrease the number of guide belts by omitting the upper belt 34' and side belt 38' in FIGS. 3 and 4.

What is claimed is:

1. An apparatus for marking packaged semiconductor devices, comprising:
a tubular holder for holding therein a plurality of packaged semiconductor devices in a single file, which is generally rectangular in cross-sectional shape and has two opposite side walls, a downside wall and an upside wall which has a lengthwise opening to expose an upside face of each of the packaged semiconductor device in the holder;

a belt conveyor comprising a conveyor belt on which said tubular holder is placed with said downside wall in contact with the belt, the conveyor belt being arranged so as to pass a marking station where a laser beam is projected from a laser beam marker so as to impinge on the upside face of one of semiconductor devices in said tubular holder;

at least one upper guide belt which makes tight contact with the upside wall of said tubular holder on said conveyor belt and is driven so as to advance in the same direction as said conveyor belt;

at least one side guide belt which makes tight contact with one of the two side walls of said tubular holder on said conveyor belt and is driven so as to advance in the same direction as said conveyor belt;

first shift means for varying a first distance which is the distance between said conveyor belt and said at least one upper guide belt;

second shift means for varying a second distance which is the distance between each of said at least one side guide belt and a plane which is perpendicular to said conveyor belt and contains a longitudinal center axis of the conveyor belt; and control means for computing said first and second distances according to the height and width of said tubular holder and controlling the operation of said first and second shift means according to the results of computation of said first and second distances.

2. An apparatus according to claim 1, wherein said conveyor belt is parallel to a horizontal plane, said at least one upper guide belt being a combination of two guide belts one of which is positioned on one side of said lengthwise opening of said tubular holder and the other on the opposite side, said at least one side guide belt being a combination of two guide belts which make tight contact with said two opposite side walls of said tubular holder, respectively.

3. An apparatus according to claim 1, wherein said conveyor belt is widthwise tilted whereby said tubular holder on the conveyor belt tilts sidewise, said at least one upper guide belt and said at least one side guide belt being tilted in conformance with the tilt of the conveyor belt.

4. An apparatus according to claim 3, wherein said at least one upper guide belt is a single guide belt which is positioned on a lower side region of the tilted upside wall of the tubular holder, said at least one side guide belt being a single guide belt which makes tight contact with the lower side wall of the tilted tubular holder.

* * * * *